US011881498B2

(12) United States Patent
Klamkin

(10) Patent No.: US 11,881,498 B2
(45) Date of Patent: Jan. 23, 2024

(54) PHOTODETECTOR CIRCUIT COMPRISING A COMPOUND SEMICONDUCTOR DEVICE ON SILICON

(71) Applicant: Aeluma, Inc., Goleta, CA (US)

(72) Inventor: Jonathan Klamkin, Santa Barbara, CA (US)

(73) Assignee: Aeluma, Inc., Goleta, CA (US)

( * ) Notice: Subject to any disclaimer, the term of this patent is extended or adjusted under 35 U.S.C. 154(b) by 252 days.

(21) Appl. No.: 17/356,208

(22) Filed: Jun. 23, 2021

(65) Prior Publication Data

US 2022/0415955 A1 Dec. 29, 2022

(51) Int. Cl.
*H01L 27/146* (2006.01)
*H01L 31/109* (2006.01)
(Continued)

(52) U.S. Cl.
CPC .. *H01L 27/14645* (2013.01); *H01L 27/14621* (2013.01); *H01L 31/03046* (2013.01); *H01L 31/035218* (2013.01); *H01L 31/109* (2013.01)

(58) Field of Classification Search
CPC ........... H01L 27/1461; H01L 27/14627; H01L 27/14634; H01L 27/14645;
(Continued)

(56) References Cited

U.S. PATENT DOCUMENTS

| 4,745,446 A * | 5/1988 | Cheng ................. H01L 27/0605 |
| | | 257/E27.128 |
| 6,359,322 B1 * | 3/2002 | Haralson ............... H01L 31/107 |
| | | 438/96 |

(Continued)

OTHER PUBLICATIONS

F. E. Ejeckam, C. L. Chua, Z. H. Zhu and Y. H. Lo, "High-performance InGaAs photodetectors on Si and GaAs substrates," Proceedings IEEE/Cornell Conference on Advanced Concepts in High Speed Semiconductor Devices and Circuits, Ithaca, NY, USA, 1995, pp. 194-200, doi: 10.1109/CORNEL.1995.482435. (Year: 1995).*

*Primary Examiner* — Sitaramarao S Yechuri
(74) *Attorney, Agent, or Firm* — Richard T. Ogawa; Ogawa P.C.

(57) ABSTRACT

Techniques for realizing compound semiconductor (CS) optoelectronic devices on silicon (Si) substrates are disclosed. The integration platform is based on heteroepitaxy of CS materials and device structures on Si by direct heteroepitaxy on planar Si substrates or by selective area heteroepitaxy on dielectric patterned Si substrates. Following deposition of the CS device structures, device fabrication steps can be carried out using Si complimentary metal-oxide semiconductor (CMOS) fabrication techniques to enable large-volume manufacturing. The integration platform can enable manufacturing of optoelectronic devices including photodetector arrays for image sensors and vertical cavity surface emitting laser arrays. Such devices can be used in various applications including light detection and ranging (LIDAR) systems for automotive and robotic vehicles as
(Continued)

well as mobile devices such as smart phones and tablets, and for other perception applications such as industrial vision, artificial intelligence (AI), augmented reality (AR) and virtual reality (VR).

28 Claims, 11 Drawing Sheets

(51) Int. Cl.
*H01L 31/0352* (2006.01)
*H01L 31/0304* (2006.01)

(58) Field of Classification Search
CPC ......... H01L 27/14689; H01L 27/14694; H01L 27/14621; H01L 31/03042; H01L 31/03046; H01L 31/035218; H01L 31/1075; G01S 7/4813; G01S 7/4816
See application file for complete search history.

(56) References Cited

U.S. PATENT DOCUMENTS

| | | | |
|---|---|---|---|
| 7,902,512 B1* | 3/2011 | Chang | H01L 27/14603 250/370.01 |
| 2002/0061648 A1* | 5/2002 | Lo | H01L 33/0066 438/689 |
| 2009/0152664 A1* | 6/2009 | Klem | H01L 31/036 257/466 |
| 2012/0313204 A1* | 12/2012 | Haddad | H04H 20/57 257/E31.127 |

\* cited by examiner

PHOTODETECTOR CIRCUIT COMPRISING A COMPOUND SEMICONDUCTOR DEVICE ON SILICON

BACKGROUND OF THE INVENTION

Electronic devices have proliferated over the years. From an iPhone 12 designed and sold by Apple Inc. to advanced networks for selling almost any type of good by Amazon.com Inc., electronic devices have entered into almost every aspect of our daily lives. These devices rely on miniature chips made from semiconductor materials, commonly silicon ("Si"). These silicon materials are also used to make sensing devices that can capture images of objects or scenes. Silicon is widely used because it is an abundant material and siliconbased semiconductor manufacturing is mature due to the investments made in the electronics industry. A common technology process is called complementary metal oxide semiconductor, or "CMOS." The CMOS technology was developed for manufacturing integrated circuits but is now used for image sensors. Such image sensors are called CMOS image sensors. Often times, such CMOS image sensors are manufactured using high-volume manufacturing with 12-inch silicon wafers.

Despite the advances with CMOS image sensors, limitations or drawbacks exist. For example, CMOS image sensors have limitations in the detectable wavelength range. Additionally, such CMOS image sensors suffer from poor sensitivity at longer wavelengths within the detectable wavelength range. These and other limitations may also exist.

From the above, it is desired that industry develop improved sensing devices.

BRIEF SUMMARY OF THE INVENTION

The present invention is generally related to electronic devices. More specifically, the present invention provides techniques related to optoelectronic devices such as, but not limited to, photodetectors and photodetector array circuits using heteroepitaxy of compound semiconductor ("CS") materials on silicon, along with subsequent circuit fabrication and integration methods. Merely by way of example, the present invention can be applied to various applications including image sensing, range finding, including LIDAR (light detection and ranging), among others, but it will be recognized that there are many other applications.

In a specific embodiment, the present invention provides a device including a circuit for a photodetector device. The photodetector device includes, among other elements, a first terminal and a second terminal. The photodetector device includes a Si substrate comprising a surface region. The device has a buffer material comprising a CS material deposited on the surface region of the Si substrate using direct heteroepitaxy such that the CS material is characterized by a first bandgap characteristic, a first thermal characteristic, a first polarity, and a first crystalline characteristic, and the Si substrate is characterized by a second bandgap characteristic, a second thermal characteristic, a second polarity, and a second crystalline characteristic. The device has an array of photodetectors, the array being characterized by N and M pixel elements, where N is an integer greater than 7, and M is an integer greater than 0.

In an embodiment, each of the pixel elements has various features. In an embodiment, each pixel element has a characteristic length ranging from 0.3 micrometers to 50 micrometers. In an embodiment, each pixel element has a preferred characteristic length ranging from 0.3 micrometers to 50 micrometers. In an embodiment, each of the photodetectors comprises an n-type material comprising an indium phosphide (InP) material comprising an Si impurity having a concentration ranging from $3E17$ $cm^{-3}$ to $8E18$ $cm^{-3}$, an absorption material overlying the n-type material, the absorption material comprising indium gallium arsenide (InGaAs) containing material, the absorption material being primarily free from an impurity, a p-type material overlying the absorption material, the p-type material comprising a zinc impurity or a beryllium impurity having a concentration ranging from $3E17$ $cm^{-3}$ to $5E18$ $cm^{-3}$, a first electrode coupled to the n-type material and coupled to the first terminal, and a second electrode coupled to the p-type material and coupled to the second terminal to define a two terminal device. The device has an illumination region characterized by an aperture region to allow a plurality of photons to interact with the CS material and be absorbed by a portion of the absorption material to cause a generation of mobile charge carriers that produce an electric current between the first terminal and the second terminal.

Optionally, the device has a responsivity (Amperes/Watt) greater than 0.1 Amperes/Watt characterizing the circuit, and a photodiode quantum efficiency greater than 10% characterizing the circuit.

Benefits or advantages are achieved over conventional techniques. The integration platform based on heteroepitaxy of CS materials and device structures on Si by direct or selective heteroepitaxy enables large-volume manufacturing of optoelectronic devices, such as image sensor and laser arrays. These devices fabricated using the present techniques can exhibit improved detectable wavelength range, higher sensitivity, and other related performance metrics. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1A:
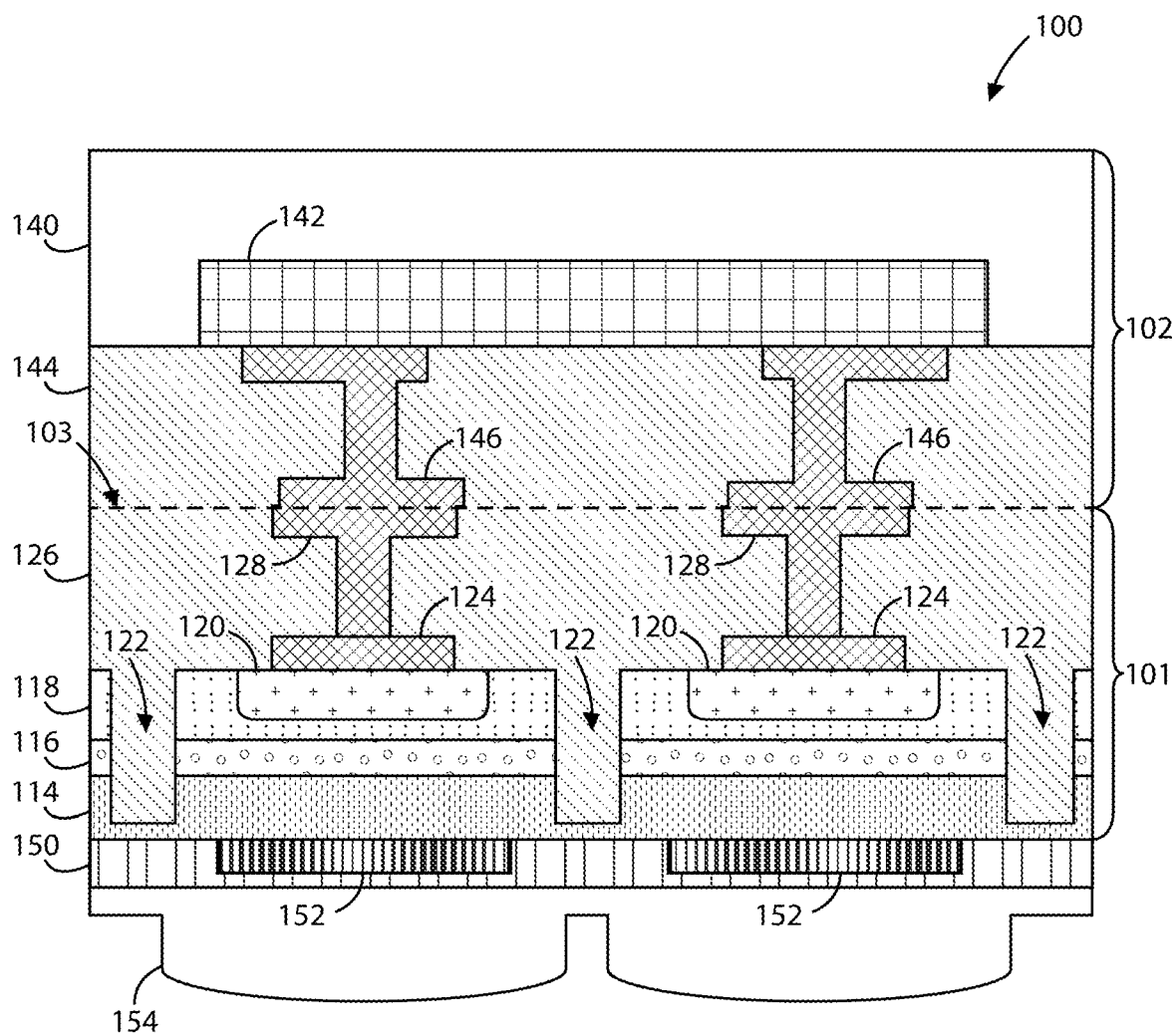
FIG. 1A is a simplified diagram of a circuit device including a photodetector array circuit coupled to a readout circuit according to an example of the present invention.

The present invention is generally related to electronic devices. More specifically, the present invention provides techniques related to optoelectronic devices such as, but not limited to, photodetectors and photodetector array circuits using heteroepitaxy of CS materials on Si, along with subsequent circuit fabrication and integration methods. Merely by way of example, the present invention can be applied to various applications including image sensing, range finding, including LIDAR, among others, but it will be recognized that there are many other applications.

In an example, the present invention provides method and device for realizing highly manufacturable and scalable semiconductor optoelectronic devices, including photodetector circuit arrays, on Si substrates. By directly depositing CS materials on Si substrates, mature Si microelectronics manufacturing processes can be leveraged to fabricate high performance photodetector circuits. Deposition on 12-inch Si substrates, which are common for CMOS technologies, enables the subsequent fabrication in CMOS manufacturing lines, however, the technology is not limited to 12-inch Si substrates only. CS materials can be deposited directly onto Si substrates with the techniques described in the present invention.

The technique to describe the direct deposition of CS materials is referred to herein as heteroepitaxy. The heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, silicon on insulator (SOI), miscut Si, SOI on miscut Si, or germanium (Ge) on Si, without departing from the scope of the invention.

In an embodiment of the present invention, CS material is deposited onto a Si substrate by heteroepitaxy, by firstly depositing a buffer material that includes an initial nucleation on the Si surface and enables the trapping, annihilation, and/or filtering of defects near the interface between the CS material and the Si surface. The initial nucleation step may be carried out at a relatively low temperature, and the subsequent buffer material growth intended to trap, annihilate and/or filter defects may be carried out at a higher temperature. Surface treatment may be carried out prior to the initial nucleation on the Si surface. This treatment may include, but is not limited to, chemical cleaning and/or treatment of the Si surface, reordering of the Si surface with high-temperature annealing in an ambient, high-temperature annealing in an ambient to remove and/or treat a surface oxide, or the formation of various Si crystal planes by treatment or etching.

The initial nucleation and buffer growth can be carried out with a number of methodologies, and combinations of methodologies, including, but not limited to, initial group IV (e.g., Si or Ge material) growth for surface reordering or reparation followed by CS growth for defect trapping, or Si surface patterning or structuring, that may include formation of various Si crystal planes, followed by CS nucleation and growth, or low-temperature CS nucleation, or low-temperature CS nucleation followed by multi-step growth with temperature grading for defect bending and annihilation, or use of strained layer superlattices, interfaces with high strain fields, graded or step-graded layers, or other similar techniques to redirect, trap, convert, and/or annihilate defects.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear devices for optical comb or frequency generation. Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), and uni-traveling-carrier (UTC) photodiodes.

The optoelectronic devices and device arrays realized with deposition of CS materials on Si can be leveraged in various applications, including, but not limited to, LIDAR; LIDAR for autonomous vehicles including, but not limited to, automobiles, aerial vehicles, airplanes, jets, drones, robotic vehicles; advanced driver assistance systems (ADAS); LIDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) imaging; smart building, security, people counting; thermal imaging, thermography; heating, ventilation and air conditioning (HVAC);

In addition to the group III-V CS materials, the techniques of the present invention could apply to other materials for photodetector circuits including, but not limited to, II-VI compounds, IV-VI compounds, II-V compounds, or IV-IV compounds.

In another embodiment, the CS nucleation, buffer materials and subsequent photodetector materials may be deposited and formed by selective area heteroepitaxy, whereby the Si or similar substrate could be first patterned with a dielectric to form recesses, within which the CS nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

FIG. 1A is a simplified diagram of a circuit device 100 including a photodetector array circuit 101 coupled to a readout circuit 102 according to an example of the present invention. As shown, the photodetector circuit 101 is bonded to the CMOS readout circuit 102 at the bond interface 103. The steps for front-end fabrication of the photodetector circuit and the CMOS circuit may vary in detail or order, without departing from the scope of the invention. In an example, each photodetector device structure in the array 101 is formed with an n-type CS material 114, a CS absorption material 116, a p-type CS material 120 (configured within a CS material 118), a p-metal contact 124 coupled to a first terminal 128 (i.e., the anode), and an n-metal contact coupled to a second terminal 130 (i.e., the cathode). The n-metal contact/second terminal coupling may be made from the topside of the photodetector circuit, or from the backside, without departing from the scope of the invention. These photodetector devices can be separated by isolation trenches 122.

Figure 1B:
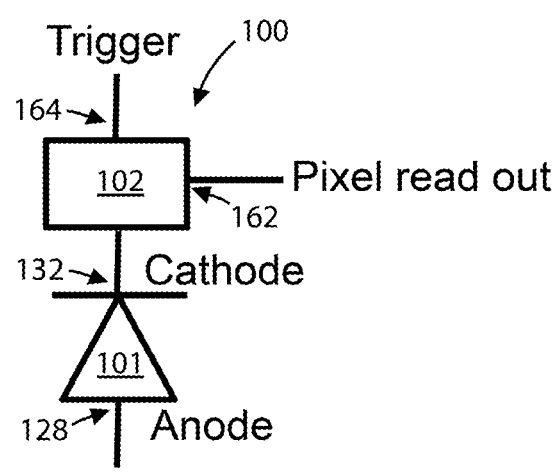
FIG. 1B is a simplified circuit diagram of the photodetector array circuit coupled to the readout circuit shown in FIG. 1A.

The readout circuit 102 comprises a Si substrate 140, which can include the readout integrated circuits (ROIC) 142 and other front-end integrated circuits (ICs). The metal layers of the readout circuit 102 within the dielectric layer 144 can include terminals (e.g., first input terminals 146 and second input terminals) that connect to the anode terminals 128 and cathode terminals 130 of the photodetector 101 at the bond interface 103. FIG. 1B shows a simplified circuit diagram representation of device 100 with the photodetector 101 coupled to the readout circuit 102 with terminals for pixel read out 162 and triggering 164. Those of ordinary skill in the art will recognize other variations, modifications, and alternatives to the configuration for metal contacts and terminal connections.

The steps for the backend fabrication, including bonding, backside contact, optical coating, color filter integration, or lens attachment, may vary in detail or order, without departing from the scope of the invention. In an example of the invention, the Si handle substrate and some of the CS materials (see substrate 110 and CS buffer material 112 in FIG. 2) are removed from the backside of the photodetector circuit following face-to-face bonding to the Si CMOS circuit. This removal process can be used to form an illumination region configured to allow light to interact with the photodetector materials (e.g., CS absorption material). An optical coating 150 and/or color filters 152 may be applied to the n-type CMOS material to assist in defining the illumination apertures for pixel elements. A lens array 154 may be coupled to the optical coating 150/color filter 152 for increasing the coupling of light to each pixel element to improve the responsivity of the photodetector circuit. The photodetector circuit of FIG. 1 represents a back side illuminated (BSI) photodetector. A modified front side illuminated (FSI) photodetector circuit may be realized by CS heteroepitaxy on Si without departing from the scope of the invention.

Figure 2:
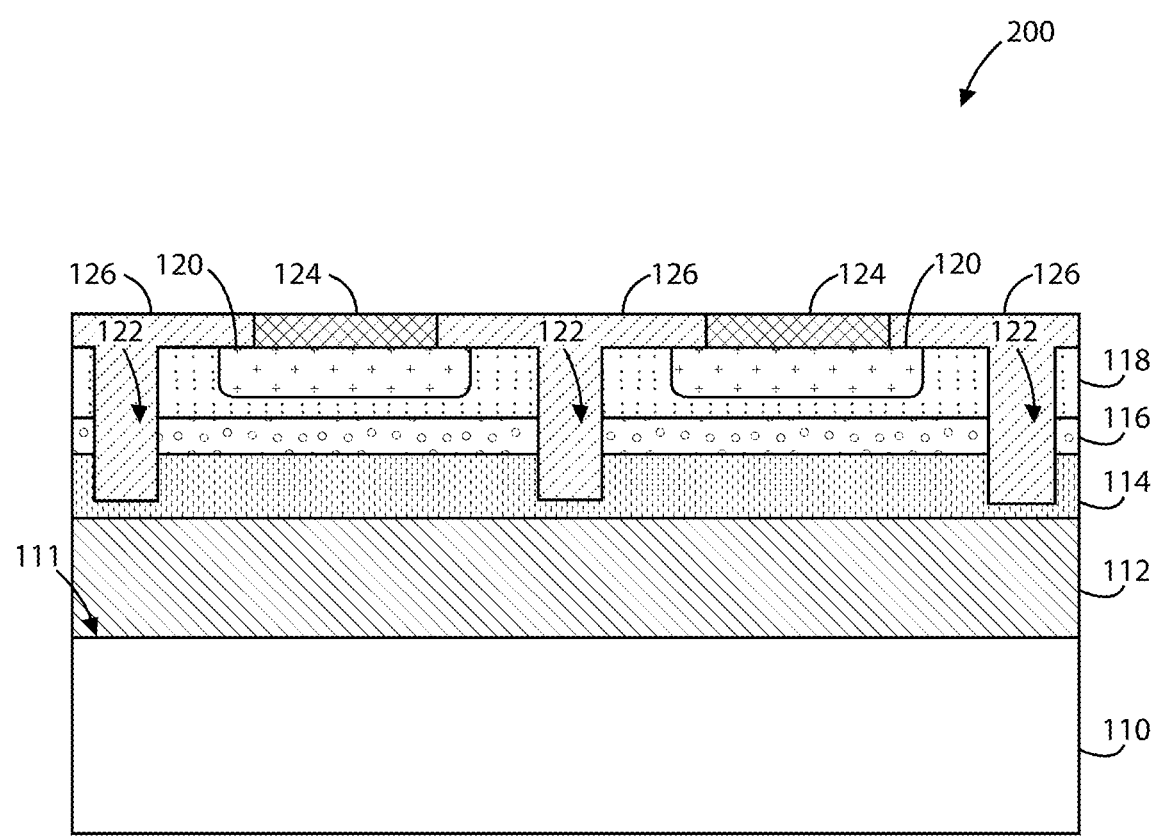
FIG. 2 is a simplified diagram of a photodetector circuit device according to an example of the present invention.

FIG. 2 is a simplified diagram of a photodetector array circuit device 200 according to an embodiment of the present invention. As discussed previously, the present invention can include depositing CS materials overlying a Si substrate by heteroepitaxy to form a CS material stack. Device 200 can represent a prior fabrication stage of the photodetector array circuit (device 101 of FIG. 1) that is bonded to the CMOS circuit (device 102 of FIG. 1). Here, a CS buffer material 112 is spatially configured overlying the Si surface 111 of the Si substrate 110. Photodetector device materials, including an n-type CS material 114, an CS absorption material 116, a CS material 118, are spatially configured overlying the CS buffer material 112. One or more p-type CS regions 120 are configured within one or more portions of the CS material 118. One or more isolation trenches 122 are configured within portions of the photodetector device materials (i.e., layers 114, 116, and 118) and filled with a dielectric material 126 for optical or electrical isolation, or alternatively or inclusively with other material such as a metal, which can separate individual CS photodetector devices of the array.

Each of the photodetectors can be configured with metal contacts (or electrodes) to the n-type CS material 114 and to the p-type CS materials 120. In FIG. 2, a p-contact metal 124 is configured overlying each of the p-type CS materials 120, and, although not shown, n-contact metals can be coupled to the n-type CS material 114. The n-metal contact and coupling may be made from the topside of the photodetector circuit 112, or from the backside, without departing from the scope of the invention. The p-contact metals 124 can be further coupled to a first terminal 128 (e.g., an anode), and the n-contact metals can be coupled to a second terminal (e.g., a cathode).

According to an example, the present invention provides a circuit for a photodetector. The photodetector circuit includes a buffer material formed (or deposited) overlying a surface region of a Si substrate, or the like. This buffer material can include a CS material deposited on the surface region of the Si substrate using direct heteroepitaxy such that the CS material is characterized by a first bandgap characteristic, a first thermal characteristic, a first polarity, and a first crystalline characteristic. Compared to the buffer material, the Si substrate is characterized by a second bandgap characteristic, a second thermal characteristic, a second polarity, and a second crystalline characteristic.

In a specific example, the CS material can include InP, InGaAs, gallium arsenide (GaAs), gallium phosphide (GaP), indium gallium arsenide phosphide (InGaAsP), indium aluminum gallium arsenide (InAlGaAs), indium arsenide (InAs), indium gallium phosphide (InGaP), or a combination thereof.

The photodetector circuit also includes an array of photodetectors. This array is characterized by N and M pixel elements (i.e., N×M array; N>0, M>0). In a specific example, N is an integer greater than 7, and M is an integer greater than 0. Each of these pixel elements has a characteristic length ranging from 0.3 micrometers to 50 micrometers. Also, each of the photodetectors includes an n-type material, an absorption material overlying the n-type material, and a p-type material overlying the absorption material.

In a specific example, the n-type material can include an InP material with a silicon impurity having a concentration ranging from $3E17\ cm^{-3}$ to $5E18\ cm^{-3}$. The absorption material can include an InGaAs containing material and can be primarily (or substantially) free from any impurity. And, the p-type material can include a zinc impurity or a beryllium impurity having a concentration ranging from $3E17\ cm^{-3}$ to $5E18\ cm^{-3}$.

In an alternative photodetector CS device structure, the n-type material includes a GaAs material comprising an silicon impurity having a concentration ranging from $3E17\ cm^{-3}$ to $5E18\ cm^{-3}$, the absorption material includes an InAs quantum dot material, and the p-type material includes a zinc impurity or a beryllium impurity or a carbon impurity having a concentration ranging from $3E17\ cm^{-3}$ to $1E20\ cm^{-3}$.

Additionally, the photodetector device structure can be configured with a separate absorption material comprising InGaAs or InGaAsP, and a multiplication material comprising InP whereby the multiplication material generates additional charge carriers by avalanche gain.

The photodetector circuit also includes a first electrode coupled to the n-type material and coupled to a first terminal, as well as a second electrode coupled to the p-type material and coupled to a second terminal. This configuration defines each photodetector as a two terminal device (i.e., having anode and cathode terminals).

The photodetector circuit also includes an illumination region characterized by an aperture region to allow a plurality of photons to interact with the CS material and be absorbed by a portion of the absorption material to cause a generation of mobile charge carriers that produce an electric current between the first terminal and the second terminal. In a specific example, the Si substrate is configured to allow the photons to traverse there through. The illumination region can also be configured to be free from any portion of the silicon substrate. A color filter can be configured overlying (or otherwise coupled to) the illumination region, and a lens can be configured overlying (or otherwise coupled to) the color filter.

Further, the photodetector circuit is characterized by a responsivity greater than 0.1 Amperes/Watt and a photodiode quantum efficiency greater than 10%. The photodetector circuit can be characterized as a BSI device or a FSI depending upon the application.

The photodetector circuit device can further include an analog front-end circuit, such as a ROIC, coupled to the array of photodetectors. The ROIC includes a first input terminal, a second input terminal, and a pixel output. The first and second input terminals are coupled to the first and second terminals of the photodetectors, respectively. The photodetector circuit can also include analog-to-digital conversion functionality (e.g., configured with or as part of the ROIC. There can be other variations, modifications, and alternatives to the elements and configurations discussed above.

Further details of example fabrication methods related to devices 100 and 200 are discussed below in reference to FIGS. 3-8.

FIGS. 3-8 are simplified diagrams illustrating methods of fabricating a compound semiconductor (CS) photodetector circuit device according to an example of the present invention. In these figures, shared reference numerals in subsequent figures refer to the same elements as described in previous figures.

Figure 3:
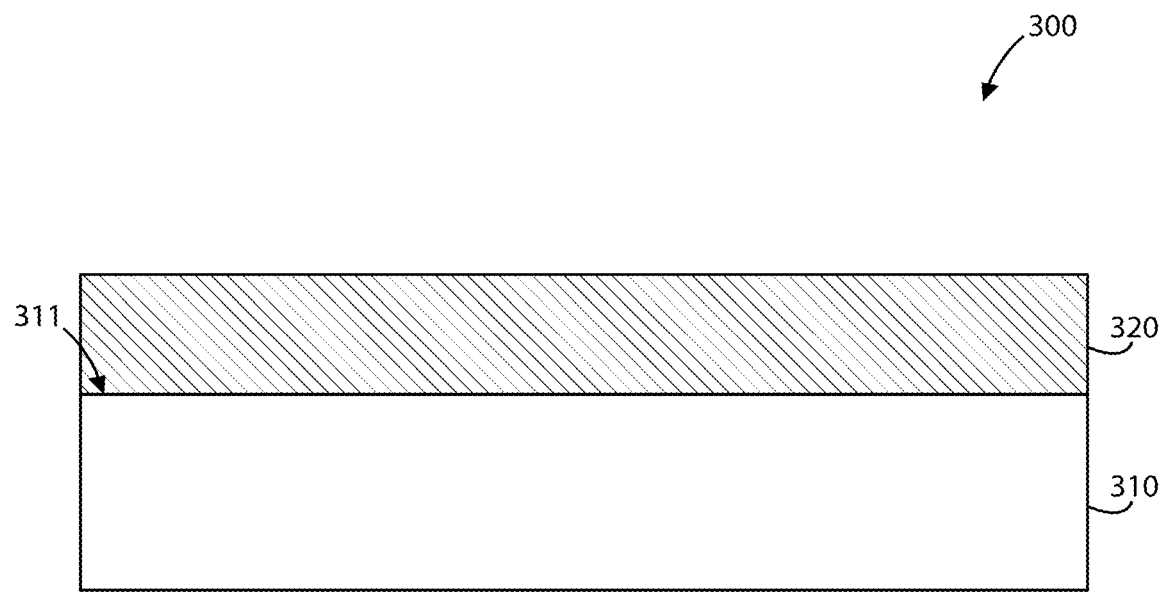
FIG. 3 is a simplified diagram of a device including CS buffer materials on a Si substrate realized by heteroepitaxy according to an example of the present invention.

FIG. 3 is a simplified diagram of a device 300 including CS buffer materials on a Si substrate realized by heteroepitaxy according to an example of the present invention. In this embodiment, a CS buffer material 320 is deposited overlying a surface region 311 of a Si substrate 310 in order to nucleate the CS material 320 and to trap and/or filter defects within the buffer material 320 and near the interface between the CS material 320 and Si surface 311. The initial nucleation and buffer material growth may be carried out with a number of methodologies, and combinations of methodologies, including, but not limited to, initial group IV material growth for surface reordering followed by group III-V CS growth for defect trapping; Si surface patterning or structuring, that may include formation of various Si crystal planes, followed by CS nucleation and growth; low-temperature CS nucleation; low-temperature CS nucleation followed by multi-step growth with temperature grading for defect bending and annihilation; use of strained layer superlattices, interfaces with high strain fields, graded or step-graded materials, or other similar techniques to redirect, trap, convert, and/or annihilate defects.

Figure 4:
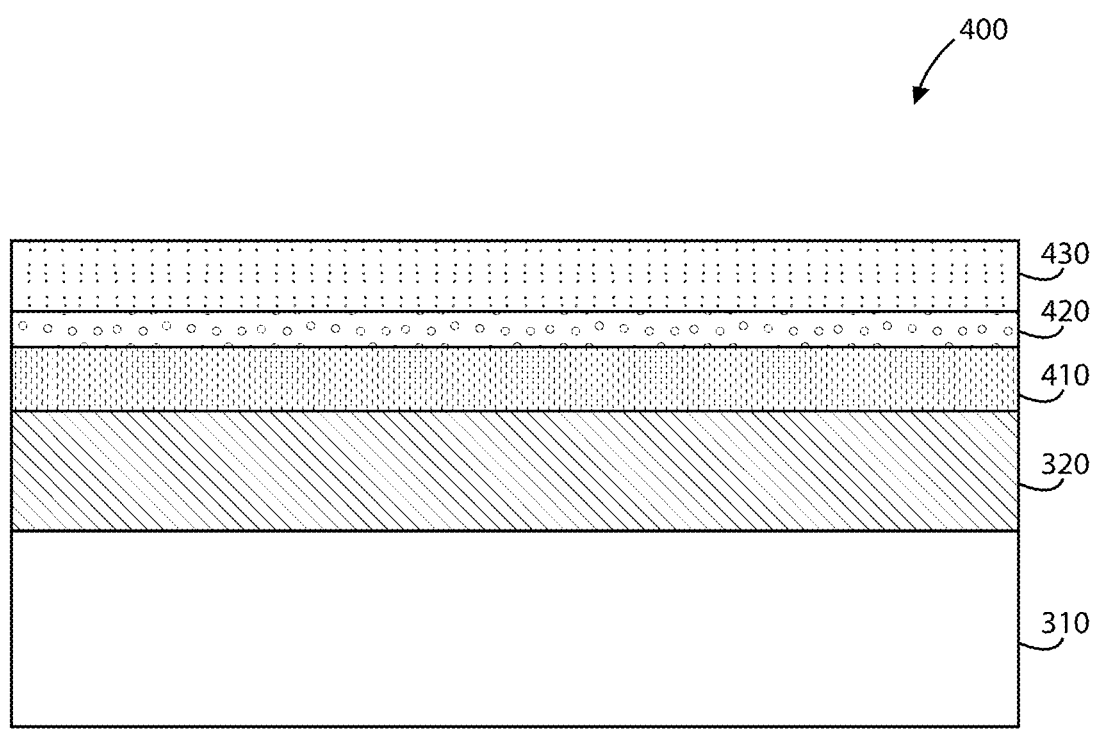
FIG. 4 is a simplified diagram of a device including CS buffer materials and CS device materials for a photodetector on a Si substrate realized by heteroepitaxy according to an example of the present invention.

As shown in device 400 of FIG. 4, following the formation of the CS buffer material 320, the photodetector device materials may be deposited overlying the CS buffer material 320 and Si substrate 310. The photodetector device materials can include an n-type CS material 410, a CS absorption material 420, and a CS material 430. In this embodiment, the CS device materials that are deposited overlying the buffer on Si (e.g., device 300 of FIG. 3) may form planar photodiode structures for the photodetector array circuit.

The n-type CS material 410 comprises a Si doping impurity and is formed overlying the buffer on Si. The CS absorption material 420, which is formed overlying the n-type material 410, is highly absorptive of light with a characteristic wavelength or wavelength range of interest. The absorption material 420 is primarily free from impurities. The CS material 430, which is formed overlying the absorption material 420, is deposited without intentional impurity. The various materials illustrated may comprise of band smoothing layers, diffusion block layers, a separate absorption layer, a charge layer, or a multiplication layer. Those of ordinary skill in the art will recognize other variations, modifications, and alternatives.

Figure 5:
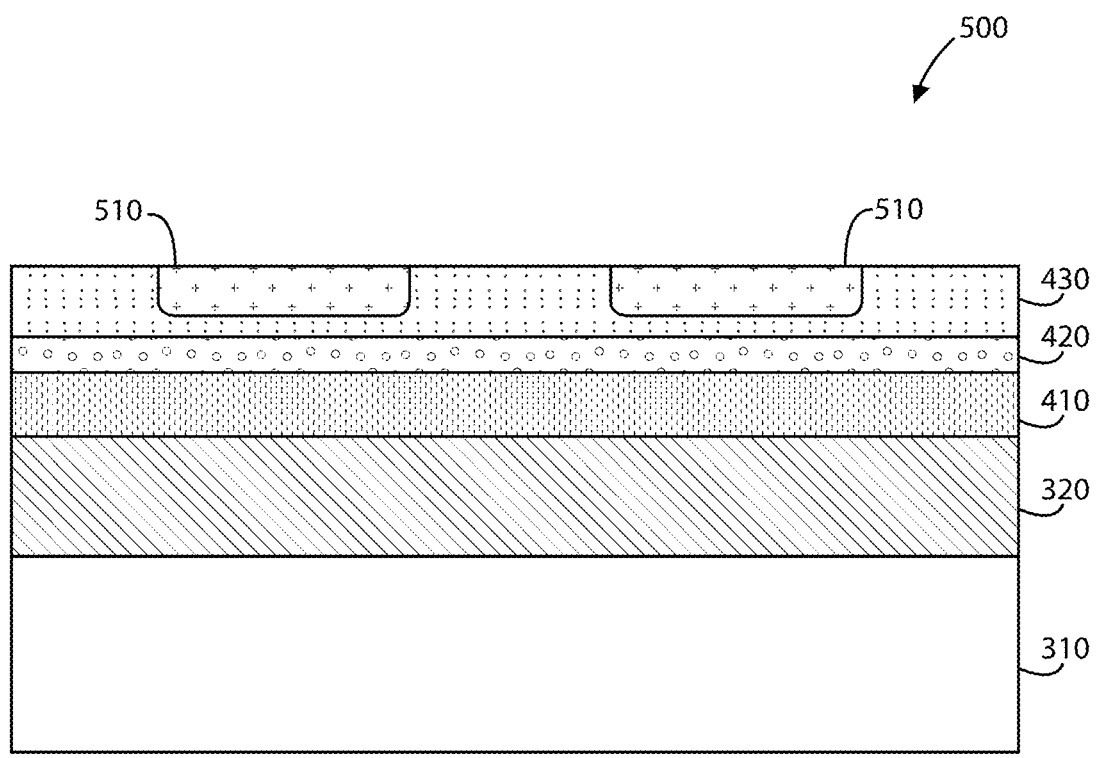
FIG. 5 is a simplified diagram of a device including CS buffer materials, CS device materials, and p-doped regions formed by diffusion, on a Si substrate realized by heteroepitaxy according to an example of the present invention.

As shown in device 500 of FIG. 5, the p-type material 510 for each photodetector is formed within a portion of the CS material 430. Depending on the specific CS material used for element 430, the p-type material 510 can be formed with diffusion of an impurity material that may be zinc, beryllium, or carbon, or the like.

Figure 6:
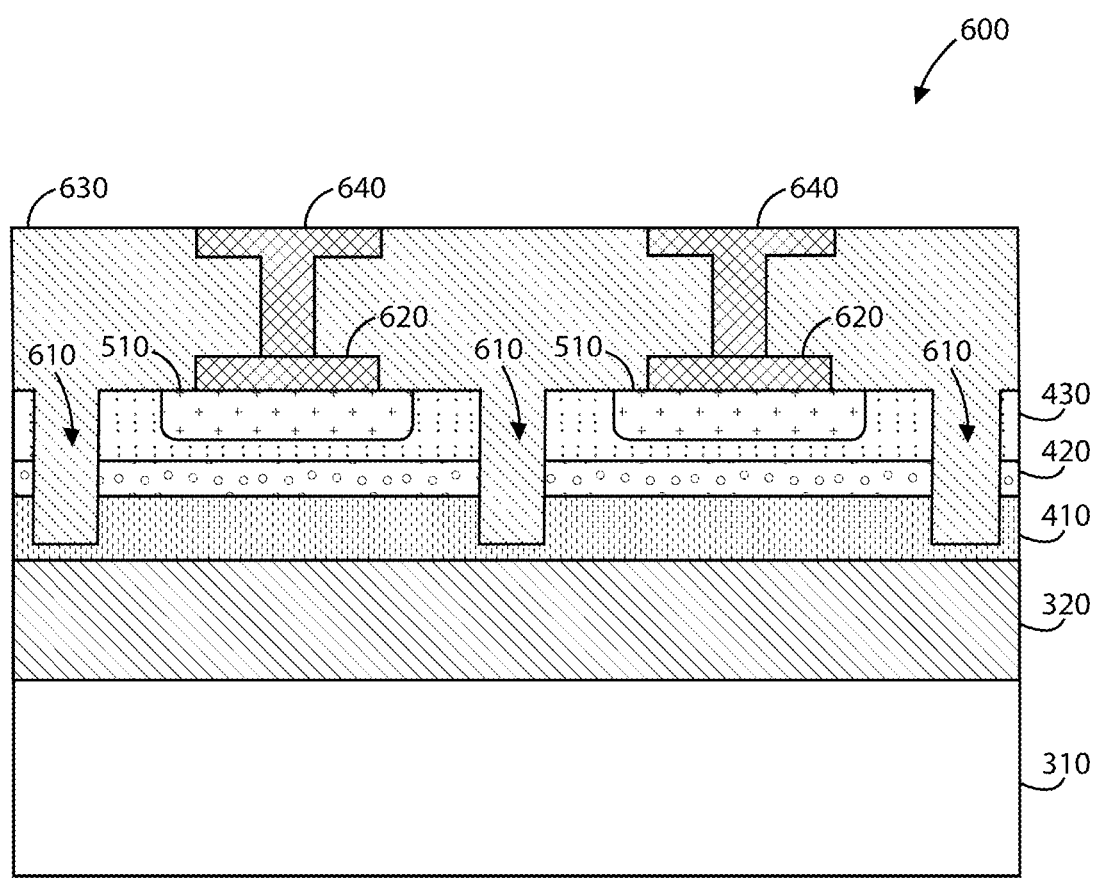
FIG. 6 is a simplified diagram of a device including CS buffer materials, CS device materials, p-doped regions formed by diffusion, isolation trenches, a planar film, metal contacts, vias, metal in vias, and top metal formed in trenches, on a Si substrate realized by heteroepitaxy according to an example of the present invention.

FIG. 6 illustrates the photodetector circuit 600 following the completion of the front-end fabrication steps (e.g., as shown previously in FIGS. 3-5). Isolation trenches 610 may be formed within portions of the photodetector device materials (i.e., layers 410-430) for optical or electrical isolation, and, in combination, to expose the n-type layer 410 (e.g., to form one or more n-contact metals). One or more p-contact metals 620 can be formed overlying the p-type materials 510. A dielectric material 630 may be deposited overlying the p-contact metals 620, the p-type materials 510, and the photodetector device materials. In this case, the dielectric material 630 also fills isolation trenches 610. Additional vias and trenches may be formed to expose the p-contact metals 620, and then the vias and trenches may be filled with metal materials 640 to provide metal connections to the p-contact metals 620 at the exposed surface region of the dielectric material 630. Of course, there can be other variations, modifications, and alternatives.

Photodetector device structures formed could include, but are not limited to, PIN photodiodes, APDs, UTC-PDs, mesa photodiodes, or planar photodiodes. Photodetectors could leverage bulk absorptive layers, including, but not limited to, InGaAs, InGaAsP, or could alternatively leverage quantum wells, quantum dashes, or quantum dots. Those of ordinary skill in the art will recognize other variations, modifications, and alternatives.

Figure 7:
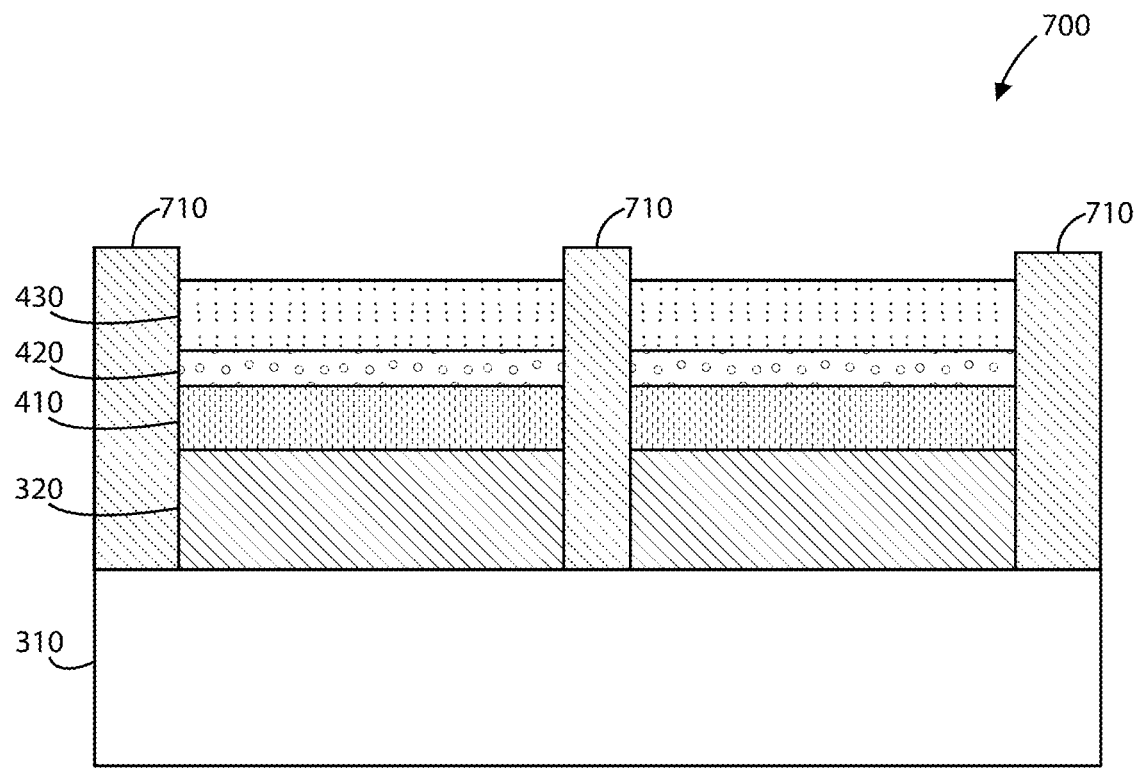
FIG. 7 is a simplified diagram of CS buffer materials and CS device materials deposited on a Si substrate realized by selective area heteroepitaxy that leverages a patterned dielectric according to an example of the present invention.
Figure 8:
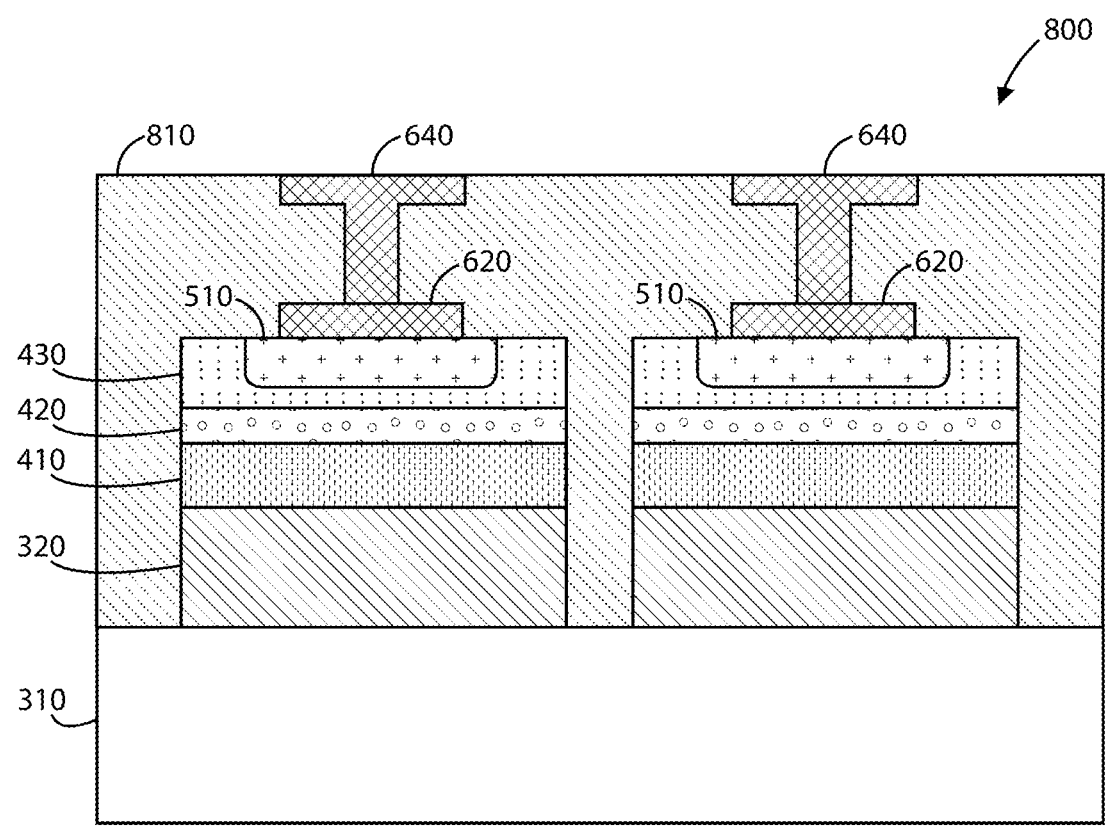
FIG. 8 is a simplified diagram of CS buffer materials, CS device materials, p-doped regions formed by diffusion, isolation trenches formed, a planar film formed, metal contacts formed, vias formed, metal in vias formed, and top metal formed in trenches, on a Si substrate realized by selective area heteroepitaxy, according to an example of the present invention.

FIG. 7 represents an alternative embodiment of a photodetector circuit 700 whereby the CS materials are deposited on the Si surface by selective area heteroepitaxy, whereby the Si surface is firstly patterned with a dielectric material 710 to form recesses, within which the CS materials would be selectively deposited on the exposed Si surface while not depositing on the dielectric material. The materials may comprise of similar or identical layers as those described for FIG. 6 (denoted by the same reference numerals). As illustrated in FIG. 8, the front-end fabrication steps for the photodetector circuit 800 following the selective heteroepitaxy of the CS materials (shown in FIG. 7) may be similar or identical to those steps utilized to form the photodetector circuit 600 in the embodiment of FIG. 6 (denoted by the same reference numerals). As shown, the dielectric material 810 (combined with dielectric material 710, if not removed) isolates the two CS material stacks formed by selective area heteroepitaxy.

Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

The embodiment of FIG. 8 may not require a separate trench isolation step (shown in FIG. 6) due to the isolation provided by the patterned dielectric, 710. Some of the dielectric between the CS areas can be removed by etching or an alternative process, and then these regions can be filled with materials, such as metals, that would be opaque, to provide additional optical isolation. Without departing from the scope of the invention, such trench isolation could alternatively be formed in a backend step following bonding of the photodetector substrate, or chips from the substrate, to a target readout circuit Si CMOS substrate.

Figure 9C:
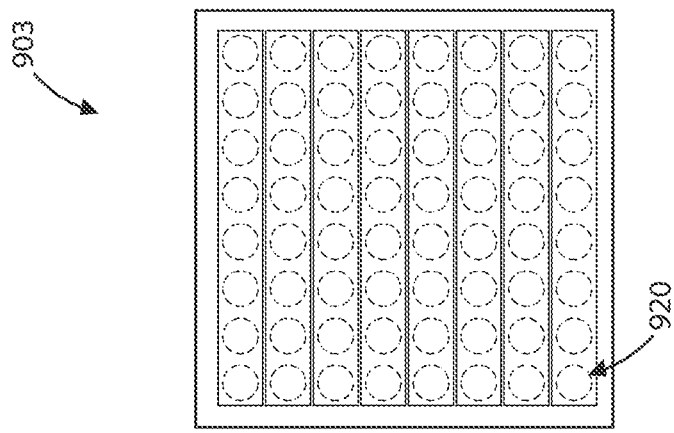
FIGS. 9A-9C are a top view description of a wafer with patterned die and top view descriptions of example dies patterned with circles or rectangular stripes for selective area heteroepitaxy, respectively, according to an example of the present invention.
Figure 9B:
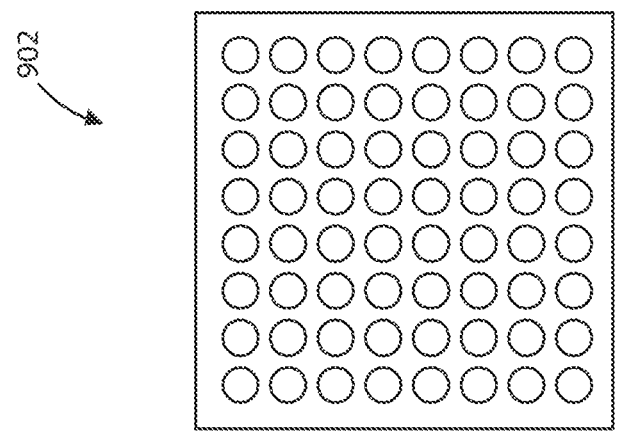
Figure 9A:
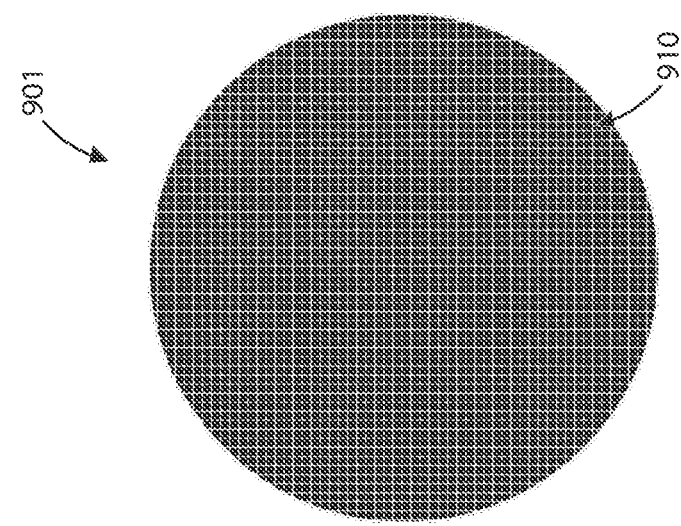

FIGS. 9A-9C are simplified diagrams illustrating wafer die patterns according to various examples of the present invention. FIG. 9A illustrates a wafer 901 with an example die pattern, where each individual die (e.g., die 910) may vary in size/area from small, such as less than 1 mm×1 mm, to a larger size that is the maximum allowable for the lithography system used. Within each die, various patterns of the dielectric can be leveraged should selective area heteroepitaxy be utilized for CS material growth on Si. Examples can include circular patterns (shown in die 902 of FIG. 9B), rectangular patterns (shown in die 903 of FIG. 9C). Pattern shape and size selection can assist, along with growth optimization and pattern fill factor, to achieve higher material quality. For the rectangular stripe patterns shown in die 903, circular photodetectors, denoted by the dashed circles (e.g., photodetector 920), could be formed following growth by mesa etching or by diffusion, the latter of which would form a planar device. The patterns represent the area from which the dielectric, for selective area heteroepitaxy, is removed to expose the Si surface below the dielectric.

Other patterns, such as, but not limited to, squares, ovals, trapezoids, different size rectangles, parallelograms, and various polygons could be leveraged without departing from the scope of the invention.

The sequence of steps to complete the realization of such photodetectors and photodetector arrays, including those represented in the embodiments of FIG. 1-9C, can be carried out in a number of ways and in different order, and the design of the device layers and structure could be varied, without departing from the scope of the invention.

Figure 10:
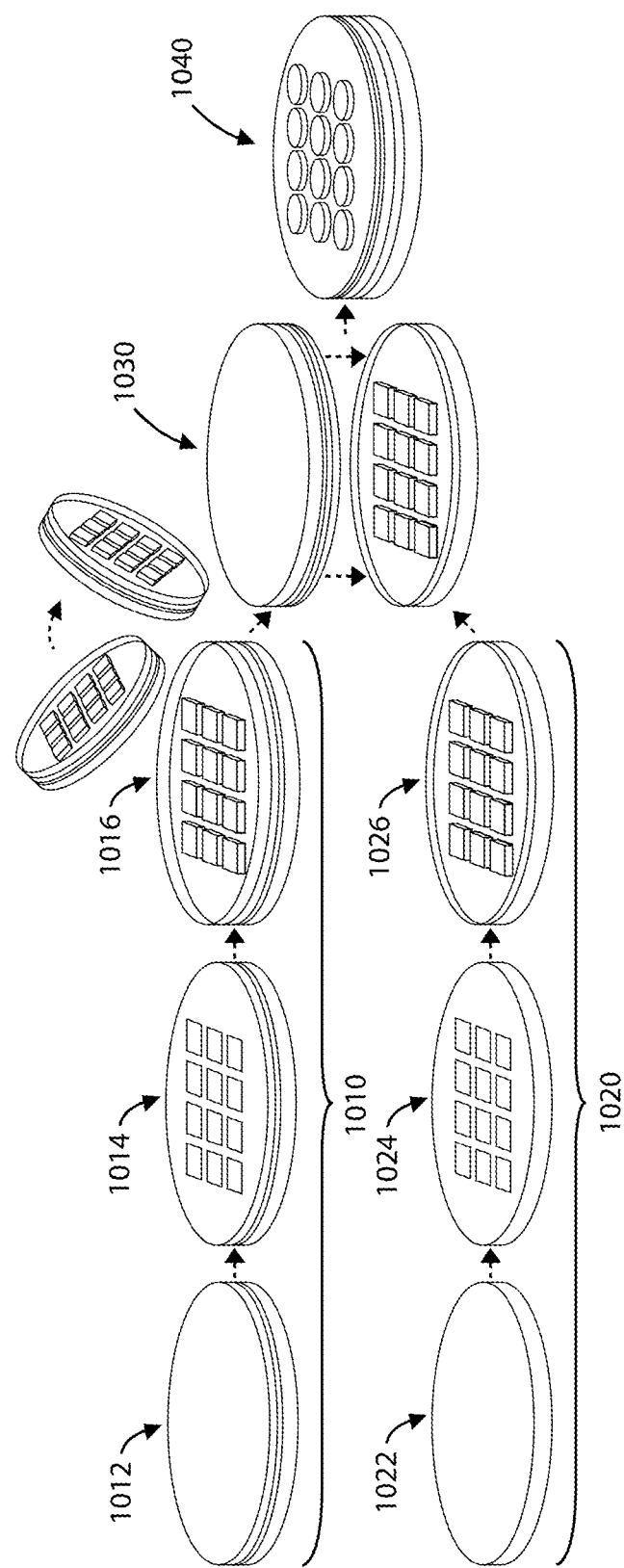
FIG. 10 is a simplified flow diagram illustrating a method to manufacture photodetectors and photodetector array circuits leveraging direct heteroepitaxy or selective area heteroepitaxy on a Si substrate, and the subsequent wafer-to-wafer bonding integration with a readout circuit wafer, followed by backside processing, according to an example of the present invention.

FIG. 10 is a simplified flow diagram illustrating a method to manufacture photodetectors and photodetector array circuits according to an example of the present invention. As shown, FIG. 10 illustrates and summarizes sequences of parallel steps that could be carried out to realize CS on Si photodetectors and photodetector arrays that are then integrated with CMOS circuits capable of functions including, but not limited to, read out, logic, AI, machine learning (ML), signal processing, and image processing. In an example, the present method includes a front-end photodetector fabrication process 1010 and a front-end CMOS IC fabrication process 1020 performed in parallel.

As shown, the front-end photodetector fabrication process 1010 can include providing a substrate 1012 (e.g., Si substrate, SOI substrate, or the like), performing CS on Si heteroepitaxy and forming device structures to produce device 1014, and performing metallization to produce device 1016. The CS on Si heteroepitaxy, device structure formation, and metallization steps can be carried out to realize structures such as, but not limited to, those described in the embodiments of FIG. 6 or FIG. 8. Other photodetector variants could also be fabricated and then follow a similar sequence of steps for integration with CMOS circuit wafers. For the front-end IC fabrication process 1020, the steps can similarly include providing a substrate 1022 (e.g., Si CMOS substrate, or the like), performing IC fabrication processes (e.g., ROIC on Si process and/or other IC front-end fabrication) to produce device 1024, and performing metallization to produce device 1026.

Following front-end fabrication of the photodetector circuits (process 1010) and the CMOS circuits (process 1020), the wafers (devices 1016 and 1026) could be bonded face-to-face (i.e., a flip-chip bonding configuration), as shown by device 1030, leveraging common bonding techniques such as, but not limited to, oxide-to-oxide and copper-to-copper (Cu-to-Cu) bonding. The precise steps for back-end fabrication, including bonding integration, could vary depending on the photodetector structure and photodetector front-end fabrication sequence, and the CMOS device structure and CMOS front-end fabrication sequence, without departing from the scope of the invention.

Following the bonding, back-end fabrications steps may be performed to produce a processed device 1040 (e.g., device 100 of FIG. 1). Such back-end fabrication steps may include, but are not limited to: removal of the photodetector handle wafer, either partially or entirely by grinding, etching, or polishing, or a combination therein; application of backside contacts, which could be made to either the n-side or p-side of the photodetector, depending on the orientation of the photodetector structure (i.e., whether the photodetector is a PIN or PN structure from the top down, or NIP or NP structure from the top down; application of color filters; application of lenses or other optics). The device structure could be FSI or BSI and the precise steps and the order of the steps could vary without departing from the scope of the invention.

Alternatively to the wafer-to-wafer process described, the fabrication of photodetectors bonded to CMOS circuits could also be carried out in a chip-to-wafer or chip-to-chip fashion. Those of ordinary skill in the art will recognize other variations, modifications, and alternatives.

Figure 11:
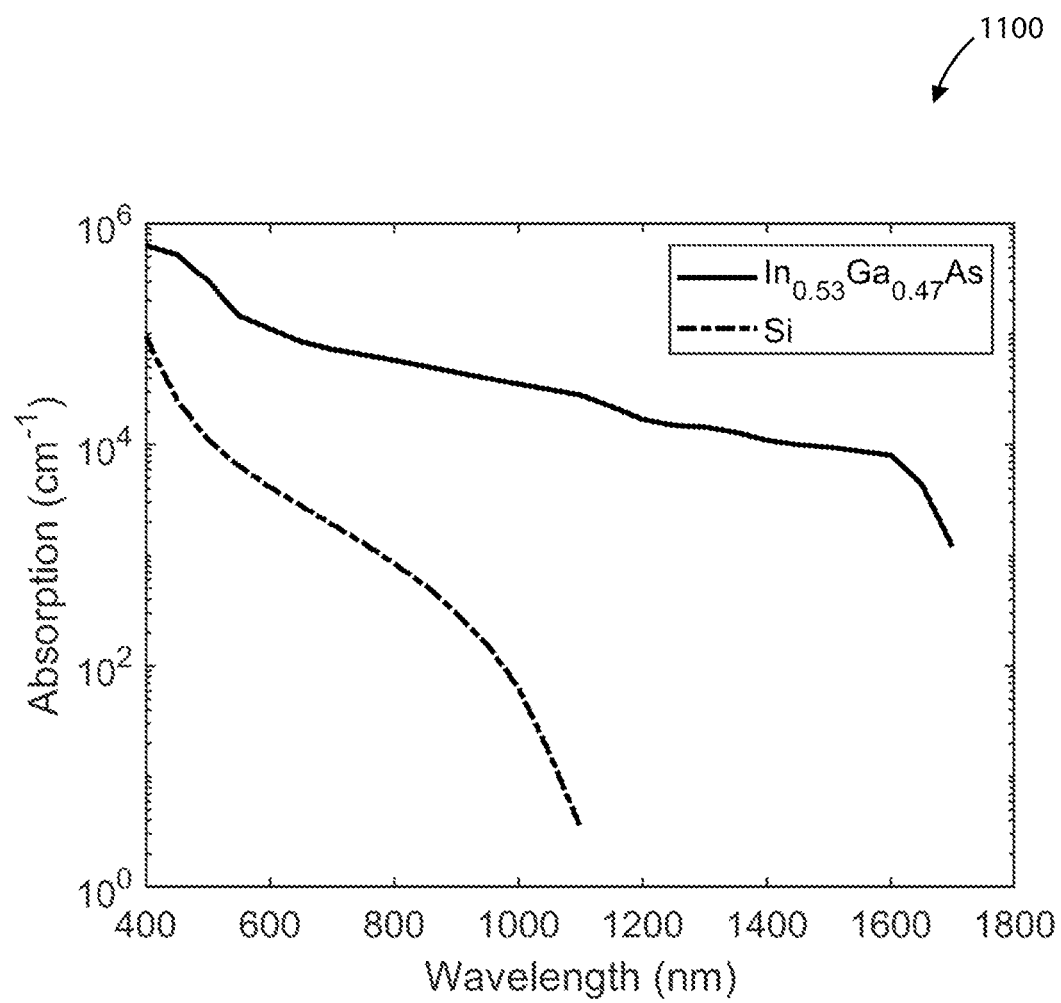
FIG. 11 is a simplified diagram illustrating a plot of the approximate absorption spectra for InGaAs material, which is used in the present invention, and Si material, which is used in conventional CMOS sensing devices.

FIG. 11 is a simplified diagram illustrating a plot 1100 of the approximate absorption spectra for InGaAs material, which is used in the present invention, and Si material, which is used in conventional CMOS sensing devices. To prove the method and device, we plotted a compilation of data for the absorption of InGaAs (solid line) and Si (dotted line) over a wide wavelength range to illustrate the benefit and advantages of the present techniques. As illustrated, the absorption of InGaAs is higher over the wavelength range considered, and the wavelength range of InGaAs extends to longer wavelength than that for Si. The spectrum illustrated for InGaAs is for an indium composition of 0.53 and a gallium composition of 0.47. This composition is commonly used as it is lattice matched to InP. The absorption wavelength range for InGaAs can be extended further to longer wavelength by altering the InGaAs composition, which incorporates strain.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A circuit for a photodetector comprising:
a first terminal;
a second terminal;
a silicon (Si) substrate comprising a surface region;
a buffer material comprising a compound semiconductor (CS) material deposited on the surface region of the Si substrate using direct heteroepitaxy such that the CS material is characterized by a first bandgap characteristic, a first thermal characteristic, a first polarity, and a first crystalline characteristic, and the Si substrate is characterized by a second bandgap characteristic, a second thermal characteristic, a second polarity, and a second crystalline characteristic;
an array of photodetectors, the array being characterized by N and M pixel elements, where N is an integer greater than 7, and M is an integer greater than 0; each of the pixel elements having a characteristic length ranging from 0.3 micrometers to 50 micrometers, each of the photodetectors comprising:
an n-type material comprising a GaAs material having an silicon impurity with a concentration ranging from $3E17$ $cm^{-3}$ to $5E18$ $cm^{-3}$;
an absorption material overlying the n-type material, the absorption material being primarily free from any impurity, and the absorption material comprising InAs quantum dot material or a quantum dash containing material;
a p-type material overlying the absorption material, the p-type material comprising a zinc impurity or a beryllium impurity or a carbon impurity having a concentration ranging from $3E17$ $cm^{-3}$ to $1E20$ $cm^{-3}$;
a first electrode coupled to the n-type material and coupled to the first terminal;
a second electrode coupled to the p-type material and coupled to the second terminal to define a two terminal device;
an illumination region characterized by an aperture region to allow a plurality of photons to interact with the CS material and be absorbed by a portion of the absorption material to cause a generation of mobile charge carriers that produce an electric current between the first terminal and the second terminal;
a responsivity (Amperes/Watt) greater than 0.1 Amperes/Watt characterizing the circuit; and
a photodiode quantum efficiency greater than 10% characterizing the circuit.

2. The circuit of claim 1 wherein the Si substrate is configured to allow the plurality of photons to traverse there through.

3. The circuit of claim 1 wherein the illumination region is free from any portion of the Si substrate.

4. The circuit of claim 1 further comprising a color filter overlying the illumination region.

5. The circuit of claim 4 further comprising a lens overlying the color filter.

6. The circuit of claim 1 wherein the CS material comprises InP, InGaAs, GaAs, GaP, InGaAsP, InAs, InAlGaAs, InGaP, or a combination thereof.

7. The circuit of claim 1 wherein the each photodetector is configured with a separate absorption material comprising InGaAs or InGaAsP, and a multiplication material comprising InP whereby the multiplication material generates additional charge carriers by avalanche gain.

8. The circuit of claim 1 is characterized as a back side illuminated (BSI) device.

9. The circuit of claim 1 is characterized as a front side illuminated (FSI) device.

10. The circuit of claim 1 further comprising:
a readout integrated circuit comprising:
a first input terminal coupled to the first terminal;
a second input terminal coupled to the second terminal; and
a pixel output.

11. The circuit of claim 10 further comprising an analog front end circuit coupled to the first input terminal and the second input terminal.

12. The circuit of claim 11 further comprising analog to digital conversion.

13. A photodetector circuit device, the device comprising:
a photodetector array circuit having a first terminal, a second terminal, and a plurality of photodetectors, each of the photodetectors comprising
an n-type compound semiconductor (CS) material,
an CS absorption material overlying the n-type material,
a p-type CS material overlying the absorption material,
a first electrode coupled to the n-type CS material and the first terminal, and
a second electrode coupled to the p-type CS material and the second terminal;
wherein the photodetector circuit includes an illumination region configured underlying the n-type CS materials of the plurality of photodetectors; and
a readout integrated circuit (ROIC) coupled to the photodetector array circuit, the ROIC having a first input terminal, a second input terminal, and a pixel output;
wherein the first input terminal is coupled to the first terminal and the second input terminal is coupled to the second terminal at an interface region between the photodetector array circuit and the ROIC; and wherein the ROIC is coupled to the photodetector array circuit in a flip-chip bonding configuration.

14. The device of claim 13 wherein the photodetector array circuit further comprises a plurality of color filters coupled to the plurality of photodetectors at the illumination region.

15. The device of claim 14 wherein the photodetector array circuit further comprises a plurality of lenses coupled to the plurality of color filters.

16. The device of claim 13 wherein the photodetector array circuit further comprises a plurality of isolation trenches separating each of the plurality of photodetectors.

17. A circuit for a photodetector comprising:
a first terminal;
a second terminal;
a silicon (Si) substrate comprising a surface region;
a buffer material comprising a compound semiconductor (CS) material deposited on the surface region of the Si substrate using direct heteroepitaxy such that the CS material is characterized by a first bandgap characteristic, a first thermal characteristic, a first polarity, and a first crystalline characteristic, and the Si substrate is characterized by a second bandgap characteristic, a second thermal characteristic, a second polarity, and a second crystalline characteristic;
an array of photodetectors, the array being characterized by N and M pixel elements, where N is an integer greater than 7, and M is an integer greater than 0; each of the pixel elements having a characteristic length ranging from 0.3 micrometers to 50 micrometers, each of the photodetectors comprising:
an n-type material;
an absorption material overlying the n-type material, the absorption material being primarily free from any impurity;
a p-type material overlying the absorption material;
a first electrode coupled to the n-type material and coupled to the first terminal;
a second electrode coupled to the p-type material and coupled to the second terminal to define a two terminal device;
an illumination region characterized by an aperture region to allow a plurality of photons to interact with the CS material and be absorbed by a portion of the absorption material to cause a generation of mobile charge carriers that produce an electric current between the first terminal and the second terminal;
a responsivity (Amperes/Watt) greater than 0.1 Amperes/Watt characterizing the circuit;
a photodiode quantum efficiency greater than 10% characterizing the circuit;

a readout integrated circuit comprising:
a first input terminal coupled to the first terminal;
a second input terminal coupled to the second terminal; and
a pixel output; and
an analog front end circuit coupled to the first input terminal and the second input terminal.

18. The circuit of claim 17 wherein the Si substrate is configured to allow the plurality of photons to traverse there through.

19. The circuit of claim 17 wherein the illumination region is free from any portion of the Si substrate.

20. The circuit of claim 17 further comprising a color filter overlying the illumination region.

21. The circuit of claim 20 further comprising a lens overlying the color filter.

22. The circuit of claim 17 wherein the CS material comprises InP, InGaAs, GaAs, GaP, InGaAsP, InAs, InAlGaAs, InGaP, or a combination thereof.

23. The circuit of claim 17 wherein the each photodetector is configured with a separate absorption material comprising InGaAs or InGaAsP, and a multiplication material comprising InP whereby the multiplication material generates additional charge carriers by avalanche gain.

24. The circuit of claim 17 wherein
the n-type material comprises an InP material comprising a silicon impurity having a concentration ranging from $3E17$ $cm^{-3}$ to $5E18$ $cm^{-3}$,
the absorption material comprising a InGaAs containing material, and
the p-type material comprises a zinc impurity or a beryllium impurity having a concentration ranging from $3E17$ $cm^{-3}$ to $5E18$ $cm^{-3}$.

25. The circuit of claim 17 wherein
the n-type material comprises a GaAs material having an silicon impurity with a concentration ranging from $3E17$ $cm^{-3}$ to $5E18$ $cm^{-3}$,
the absorption material comprises InAs quantum dot material or a quantum dash containing material, and
the p-type material comprises a zinc impurity or a beryllium impurity or a carbon impurity having a concentration ranging from $3E17$ $cm^{-3}$ to $1E20$ $cm^{-3}$.

26. The circuit of claim 17 is characterized as a back side illuminated (BSI) device.

27. The circuit of claim 17 is characterized as a front side illuminated (FSI) device.

28. The circuit of claim 17 further comprising analog to digital conversion.

* * * * *